United States Patent
Kellar et al.

(10) Patent No.: US 6,975,016 B2
(45) Date of Patent: Dec. 13, 2005

(54) WAFER BONDING USING A FLEXIBLE BLADDER PRESS AND THINNED WAFERS FOR THREE-DIMENSIONAL (3D) WAFER-TO-WAFER VERTICAL STACK INTEGRATION, AND APPLICATION THEREOF

(75) Inventors: Scot A. Kellar, Bend, OR (US); Sarah E. Kim, Portland, OR (US); R. Scott List, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 35 days.

(21) Appl. No.: 10/066,643

(22) Filed: Feb. 6, 2002

(65) Prior Publication Data

US 2003/0148596 A1 Aug. 7, 2003

(51) Int. Cl.[7] .......................... H01L 29/06; B23K 19/00; G01R 1/073
(52) U.S. Cl. ....................... 257/618; 257/777; 257/686; 257/723; 257/E21.519; 257/E21.515; 257/E21.505; 257/797; 257/620; 324/754; 324/760; 438/612; 438/107
(58) Field of Search ................................. 257/618, 620, 257/686, 723, 797, 777, E21.519, E21.515, E21.505; 324/754, 760; 438/612, 107; 156/59

(56) References Cited

U.S. PATENT DOCUMENTS

| | | | |
|---|---|---|---|
| 4,607,779 A | * | 8/1986 | Burns .......................... 228/106 |
| 4,689,113 A | | 8/1987 | Balasubramanyam et al. |
| 5,241,450 A | | 8/1993 | Bernhardt et al. |
| 5,366,906 A | | 11/1994 | Wojnarowski et al. |
| 5,401,672 A | | 3/1995 | Kurtz et al. |
| 5,419,806 A | | 5/1995 | Huebner |
| 5,455,445 A | | 10/1995 | Kurtz et al. |

(Continued)

FOREIGN PATENT DOCUMENTS

| | | | | |
|---|---|---|---|---|
| EP | 0293459 B1 | 7/1992 | | |
| WO | 8804829 A1 | * | 6/1988 | .......... 257/E21.519 |

OTHER PUBLICATIONS

"Ultra Thin Electronics for Space Applications", 2001 Electronic Components and Technology Conference, 2001 IEEE.
"Copper Wafer Bonding"; A. Fan, A. Rahman, and R. Reif; Electrochemical and Solid-State Letters, 2 (10) 534–536 (1999).
"Face to Face Wafer Bonding for 3D Chip Stack Fabrication to Shorten Wire Lengths", Jun. 27–29, 2000 VMIC Conference 2000 IMIC—200/00/0090(c).
"InterChip Via Technology for Vertical System Integration", Fraunhofer Institute for Reliability and Microintegration, Munich, Germany; Infineon Technologies AG, Munich, Germany; 2001 IEEE.

*Primary Examiner*—Alexander Oscar Williams
(74) *Attorney, Agent, or Firm*—Blakely, Sokoloff, Taylor & Zafman LLP (57) ABSTRACT

A three-dimensional (3-D) integrated chip system is provided with a first wafer including one or more integrated circuit (IC) devices; a second wafer including one or more integrated circuit (IC) devices; and a metal bonding layer deposited on opposing surfaces of the first and second wafers at designated locations to establish electrical connections between active IC devices on the first and second wafers and to provide metal bonding between the adjacent first and second wafers, when the first wafer is pressed against the second wafer using a flexible bladder press to account for height differences of the metal bonding layer across the opposing surfaces of the first and second wafers.

13 Claims, 4 Drawing Sheets

U.S. PATENT DOCUMENTS

| | | | |
|---|---|---|---|
| 5,473,197 A | 12/1995 | Idaka et al. | |
| 5,545,281 A * | 8/1996 | Matsui et al. | 156/273.7 |
| 5,627,106 A | 5/1997 | Hsu | |
| 5,658,554 A | 8/1997 | Dosal et al. | |
| 5,773,986 A * | 6/1998 | Thompson et al. | 324/754 |
| 5,880,010 A | 3/1999 | Davidson | |
| 5,886,535 A * | 3/1999 | Budnaitis | 324/760 |
| 5,998,808 A | 12/1999 | Matsushita | |
| 6,100,181 A | 8/2000 | You et al. | |
| 6,142,857 A * | 11/2000 | Cesna | 451/287 |
| 6,238,951 B1 | 5/2001 | Caillat | |
| 6,255,726 B1 | 7/2001 | Vindasius et al. | |
| 6,297,072 B1 | 10/2001 | Tilmans et al. | |
| 6,340,608 B1 | 1/2002 | Chooi et al. | |
| 6,355,501 B1 | 3/2002 | Fung et al. | |
| 6,355,976 B1 | 3/2002 | Faris | |
| 6,373,130 B1 | 4/2002 | Salaville | |
| 6,461,890 B1 * | 10/2002 | Shibata | 438/106 |
| 6,468,098 B1 * | 10/2002 | Eldridge | 439/197 |
| 6,504,253 B2 | 1/2003 | Mastromatteo et al. | |
| 6,559,042 B2 | 5/2003 | Barth et al. | |
| 6,583,512 B2 * | 6/2003 | Nakaoka et al. | 257/777 |
| 6,594,025 B2 | 7/2003 | Forouhi et al. | |
| 6,643,920 B2 | 11/2003 | Hori | |
| 6,661,085 B2 | 12/2003 | Kellar et al. | |
| 6,724,084 B1 | 4/2004 | Hikita et al. | |
| 6,762,076 B2 | 7/2004 | Kim et al. | |
| 2002/0005578 A1 * | 1/2002 | Kodama et al. | 257/727 |
| 2002/0024628 A1 * | 2/2002 | Walker et al. | 349/155 |
| 2002/0163072 A1 | 11/2002 | Gupta et al. | |
| 2003/0079836 A1 * | 5/2003 | Lin et al. | 156/345.14 |
| 2003/0157782 A1 | 7/2003 | Kellar et al. | |
| 2004/0014308 A1 | 1/2004 | Kellar et al. | |
| 2004/0142540 A1 | 7/2004 | Kellar et al. | |

\* cited by examiner

WAFER BONDING USING A FLEXIBLE BLADDER PRESS AND THINNED WAFERS FOR THREE-DIMENSIONAL (3D) WAFER-TO-WAFER VERTICAL STACK INTEGRATION, AND APPLICATION THEREOF

This application is related to the following patents and pending patent applications, which are assigned to the assignee of this application: U.S. Pat. No. 6,661,085, filed on Feb. 6, 2002 and issued on Dec. 9, 2003; U.S. patent application Ser. No. 10/066,645, filed on Feb. 6, 2002; U.S. Pat. No. 6,762,076, filed on Feb. 20, 2002 and issued on Jul. 13, 2004; U.S. patent application Ser. No. 10/613,006, filed on Jul. 7, 2003; U.S. patent application Ser. No. 10/695,328, filed on Oct. 27, 2003; and U.S. patent application Ser. No. 10/855,032, filed on May. 26, 2004.

TECHNICAL FIELD

The present invention relates to wafer bonding and, more specifically, relates to wafer bonding using a flexible bladder press and thinned wafers for three-dimensional (3D) wafer-to-wafer vertical stack integration and application.

BACKGROUND

Integrated circuits (ICs) form the basis for many electronic systems. Essentially, an integrated circuit (IC) includes a vast number of transistors and other circuit elements that are formed on a single semiconductor wafer or chip and are interconnected to implement a desired function. The complexity of these integrated circuits (ICs) requires the use of an ever increasing number of linked transistors and other circuit elements.

Many modern electronic systems are created through the use of a variety of different integrated circuits; each integrated circuit (IC) performing one or more specific functions. For example, computer systems include at least one microprocessor and a number of memory chips. Conventionally, each of these integrated circuits (ICs) is formed on a separate chip, packaged independently and interconnected on, for example, a printed circuit board (PCB).

As integrated circuit (IC) technology progresses, there is a growing desire for a "system on a chip" in which the functionality of all of the IC devices of the system are packaged together without a conventional PCB. Ideally, a computing system should be fabricated with all the necessary IC devices on a single chip. In practice, however, it is very difficult to implement a truly high-performance "system on a chip" because of vastly different fabrication processes and different manufacturing yields for the logic and memory circuits.

As a compromise, various "system modules" have been introduced that electrically connect and package integrated circuit (IC) devices which are fabricated on the same or on different semiconductor wafers. Initially, system modules have been created by simply stacking two chips, e.g., a logic and memory chip, one on top of the other in an arrangement commonly referred to as chip-on-chip structure. Chip-on-chip structures most commonly use micro bump bonding technology to electrically connect the working surfaces of two chips. Several problems, however, remain inherent with this design structure. For example, this approach is limited in the number of chips that can be interconnected as part of the system module.

In the past several years, multi-chip module (MCM) technology has been utilized to stack a number of chips on a common substrate to reduce the overall size and weight of the package, which directly translates into reduced system size. Existing MCM technology is known to provide significant performance enhancements over single chip or chip-on-chip (COC) packaging approaches. For example, when several semiconductor chips are mounted and interconnected on a common substrate through very high density interconnects, higher silicon packaging density and shorter chip-to-chip interconnections can be achieved. In addition, low dielectric constant materials and higher wiring density can also be obtained which lead to the increased system speed and reliability, and the reduced weight, volume, power consumption and heat to be dissipated for the same level of performance. However, existing MCM approaches still suffer from additional problems, such as bulky package, wire length and wire bonding that gives rise to stray inductances that interfere with the operation of the system module.

Until most recently, the most promising interconnect technology that is still within the confines of research but is close to the ideal high-performance "system on a chip" is the three-dimensional (3D) wafer-to-wafer vertical stack integration. Whereas MCM technology seeks to stack multiple chips on a common substrate, 3-D wafer-to-wafer vertical stack technology seeks to achieve the long-awaited goal of stacking many layers of active IC devices such as processors, programmable devices and memory devices inside a single chip to shorten average wire lengths, thereby reducing interconnect RC delay and increasing system performance. In direct 3-D integration, active device wafers are bonded together, while all active layers are electrically interconnected using vertical vias.

One of the major challenges of 3-D wafer-to-wafer vertical stack integration technology is the metal bonding between wafers and between die in a single chip. In general wafers are bonded one at a time in a bond chamber with pressure and heat applied through a standard rigid press. However, typical wafers to be bonded may have thickness variations in a metal bonding layer which when pressed together under constant pressure will prevent good contact and instead, make contact at only a few high points along the wafers. Therefore, it is desirable to allow for thickness variations in the metal bonding wafers and to ensure that wafers are bonded more uniformly and effectively.

BRIEF DESCRIPTION OF THE DRAWINGS

A more complete appreciation of exemplary embodiments of the present invention, and many of the attendant advantages of the present invention, will become readily apparent as the same becomes better understood by reference to the following detailed description when considered in conjunction with the accompanying drawings in which like reference symbols indicate the same or similar components, wherein.

DETAILED DESCRIPTION

The present invention is applicable for use with all types of semiconductor wafers and integrated circuit (IC) devices, including, for example, MOS transistors, CMOS devices, MOSFETs, and new memory devices and communication devices such as smart card, cellular phone, electronic tags, gaming devices which may become available as semiconductor technology develops in the future. However, for the sake of simplicity, discussions will concentrate mainly on exemplary use of wafer bonding in a three-dimensional (3-D) wafer-to-wafer vertical stack, although the scope of the present invention is not limited thereto.

Figure 1A:
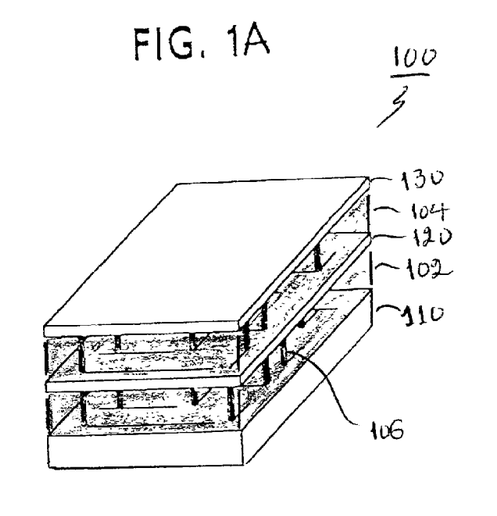
FIGS. 1A–1B illustrate an example three-dimensional (3-D) wafer-to-wafer vertical stack forming a single chip.
Figure 1B:
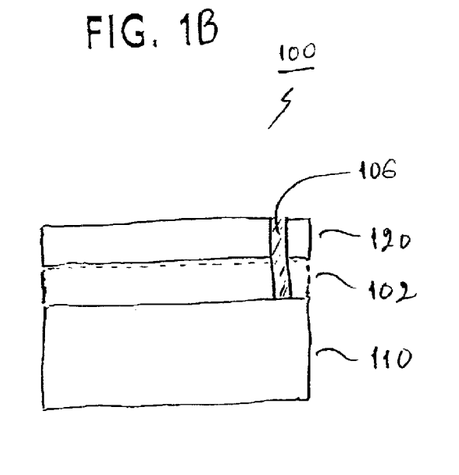

Attention now is directed to the drawings and particularly to FIGS. 1A–1B, an example three-dimensional (3-D) wafer-to-wafer vertical stack according to an embodiment of the present invention is illustrated. As shown in FIG. 1A, the 3-D chip 100 may comprise any number of active device polysilicon (Si) wafers, such as wafer #1 110 including, for example, one or more microprocessors; wafer #2 120 including one or more memory devices; and wafer #3 130 including one or more radio-frequency (RF) or optical communication devices. The bottom wafer 110 is sufficiently thick to support the stacking of the top wafers 120 and 130, and the top wafers 120 and 130 are thinned to minimize the interconnection between wafers 110, 120 and 130.

In a typical 3-D vertical stack 100 shown in FIGS. 1A–1B, the active device wafers 110, 120 and 130 may be bonded together using interlevel dielectric (ILD) layers 102 and 104, while all active layers on wafers 110, 120 and 130 may be electrically interconnected using vertical vias 106. The dielectric (ILD) layers 102 and 104 may be dielectric glues or polymer adhesives such as polyimide and epoxy, to bond wafers 110, 120 and 130 at low curing temperature ranging from 150 to 400° C. for example. However, other high-temperature deformable dielectric glues such as SILK, and bonding adhesives such as borophosphosilicate glass (BPSG) may also be used to facilitate the wafer bonding process, while maintaining electrical isolation between active devices of silicon (Si) wafers 110, 120 and 130. Interwafer vias 106 may then be etched through the ILD at designated locations, the thinned top Si wafers 120 and 130, and the cured dielectric layers 102 and 104 for providing vertical electrical interconnects between active IC devices of the bottom wafer 110 and thinned top wafers 120 and 130.

Typically, the interwafer vias 106 are prepared on the top wafer 120 as shown in FIG. 1B, for example, by etching through the dielectric (ILD) layer 102. The top wafer 120 may then be adhesively bonded to the handling bottom wafer 110 and thinned with high uniformity until the trenches are opened. After the bonding process, the bottom wafer 110 may be removed, leaving the desired wafer stack that can be further processed like a standard silicon (Si) wafer. The interwafer vias 106 are opened to a standard metallization (typically using aluminum "Al" or copper "Cu") and passivation.

However, there are still limitations regarding the use of dielectric (ILD) layers 102 and 104, and interwafer vias 106 in direct 3-D integration. For example, the interwafer vias 106 between adjacent wafers 110 and 120 are typically deep which lead to some interconnect RC delay in active IC devices. In addition, the dielectric (ILD) layers 102 and 104 can also be cost-prohibitive for mass production.

In order to reduce, if not eliminate, the use of dielectric (ILD) layers 102 and 104 between adjacent wafers 110, 120 and 130, and minimize the interconnect RC delay in active IC devices through the interwafer vias 106, proposals have been made to use a metal bonding layer in designated patterns (metallic bumps) arranged on the surface of adjacent wafers 110, 120 and 130 to serve not only as electrical connections to active IC devices on adjacent wafers 110, 120 and 130 on a 3-D wafer-to-wafer vertical stack 100 but also to bond the adjacent wafers 110, 120 and 130. Additional metallic bumps can also be made to increase the surface area for wafer bonding and serve as auxiliary structures such as ground planes or heat conduits for the active IC devices.

Figure 2:
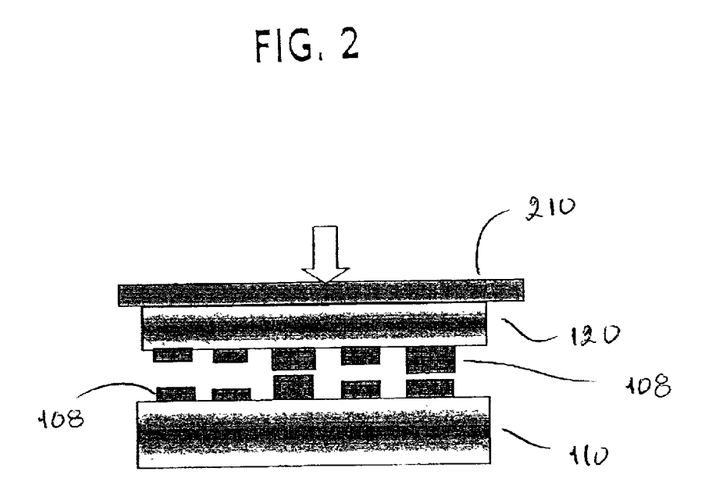
FIG. 2 illustrates an example wafer bonding process between active device wafers using metal patterns in an example 3-D wafer-to-wafer vertical stack.

FIG. 2 illustrates an example wafer bonding process between active device wafers using metal patterns in an example 3-D wafer-to-wafer vertical stack. As shown in FIG. 2, silicon (Si) wafers 110 and 120, for example, are bonded one at a time in a bond chamber with pressure and heat applied through a standard rigid press 210. A metal bonding layer 108 may be deposited on opposing surfaces of the bottom wafer 110 and the top wafer 120 at designated locations to establish electrical connections between active IC devices on adjacent wafers 110 and 120 and to bond the adjacent wafers 110 and 120, while maintaining electrical isolation between bonding areas. The metal bonding layer 108 may include a plurality of copper (Cu) lines (bumps) deposited on opposing surfaces of both wafers 110 and 120 that can serve as electrical contacts between active devices on both wafers 110 and 120. Copper (Cu) may be selected because of its low electrical resistivity and high electromigration resistance. However, aluminum (Al) and other metallic materials can also be used. Examples of additional metallic materials include nickel, silver, palladium, palladium-nickel alloy, gold, titanium, or titanium nitride or any combination thereof.

When deposited on opposing surfaces of active device wafers 110 and 120, the metal bonding layer 108 may have thickness variations across the surfaces of the wafers 110 and 120. Therefore, if the active device wafers 110 and 120 are pressed together under constant pressure from a standard rigid press 210, only a few high points of the metal bonding layer 108 along the wafers 110 and 120 will make contact while other low points remain unconnected. As a result, it is desirable for the metal bonding process to allow for thickness variations in the metal bonding layer 108 and to ensure that all active device wafers 110 and 210 are bonded more uniformly and effectively for greater wafer throughput, while maintaining electrical isolation between bonding areas.

Figure 3:
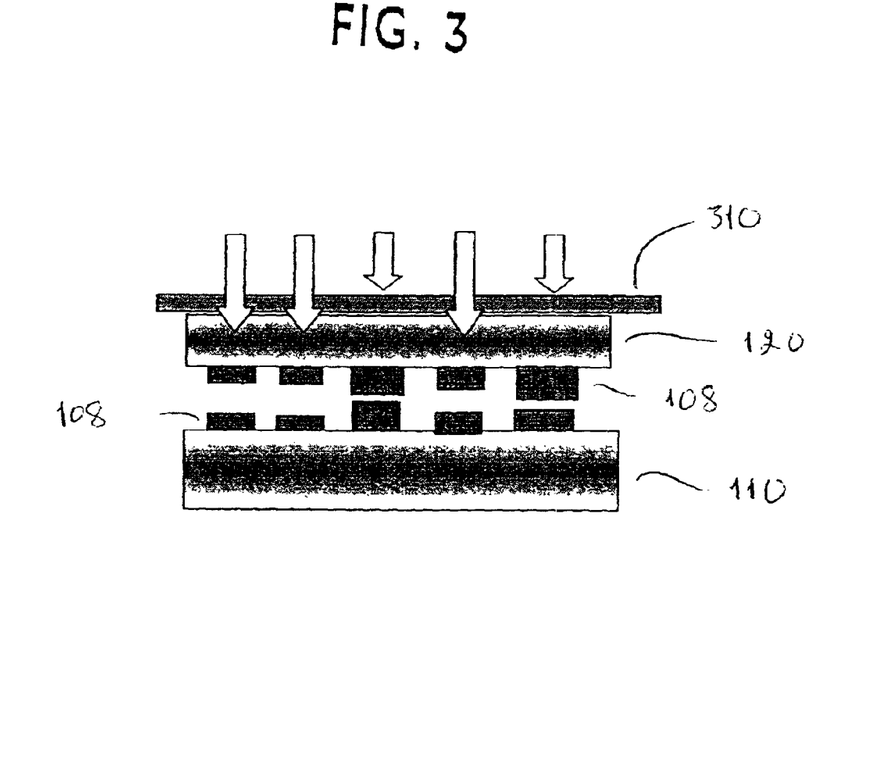
FIG. 3 illustrates an example wafer bonding adjustment process between active device wafers according to an embodiment of the present invention.

Turning now to FIG. 3, an example wafer bonding adjustment process between active device wafers according to an embodiment of the present invention is illustrated. An especially designed bladder press 310 can be advantageously utilized to conform to the local height variations of the silicon (Si) wafers and produce greater contact surface area relative to a standard rigid press. A top wafer 120 can also be sufficiently thinned so as to be much more pliable than those of standard thickness and to allow for greater thickness variations across the wafers 110 and 120 for the same applied bonding pressure.

As shown in FIG. 3, the arrow length indicates the amount of pressure needed at a particular portion of the thinned top wafer 120 to push its surface against the surface of the bottom wafer 110 to accommodate wafer thickness variations. The pressure required to account for the height differences of the metal bonding layer 108 across the opposing surfaces of the wafers 110 and 120 may depend upon the thickness and the surface area across the wafers 110 and 120. The bladder press 310 must also be sufficiently flexible to absorb the pressure asserted differently at different points so as to press the thinned top wafer 120 against the bottom wafer 110 accordingly to account for the height differences of the metal bonding layer 108 across the opposing surfaces of the top and bottom wafers 110 and 120.

For example, if the top wafer 120 is 1 mm by 1 mm square (1 mm²) and has a thickness of approximately 50 μm, a flexible bladder press 310 conformable over as small an area as 1 mm² will require only 0.8 PSI to account for a total height variation of the metal bonding layer 108 across the opposing surfaces of the wafers 110 and 120 of about 600 Å.

The pressure required to account for the height differences of the metal bonding layer 108 across the opposing surfaces of the wafers 110 and 120 may be determined based on the following equations:

$$\delta = \frac{qL^4}{8EI}, \text{ and } I = \frac{bh^3}{3}$$

Where "δ" indicates the total deflection on a Si wafer assuming that portions of a Si wafer serve as a simple cantilevered beam; "L" indicates the length of the Si wafer (beam); "q" indicates the load intensity; "E" is the Young modulus of elasticity of the Si wafer; and "I" indicates the moment of inertia of the rectangular cross-section.

As shown above, the moment of inertia "I" can be determined based on "h" the thickness of the Si wafer (beam), and "b" the cross-section dimension of the Si wafer (beam).

If an average height variation of a metal bonding layer 108 across an 8" Si wafer 120 is 600 Å after the Si wafer 120 is planarized by Chemical Mechanical Polishing (CMP), the total deflection of the Si wafer 120 may be set at 1000 Å to ensure that the Si wafer 120 will better conform to the height variations of the metal bonding layer 108 without compromising the structural integrity of the Si wafer 120. Therefore, the pressure needed to deflect the thinned Si wafer 120 to accommodate local thickness variations will depend upon the thickness of the Si wafer 120 as described with reference to the above equations.

Figure 4:
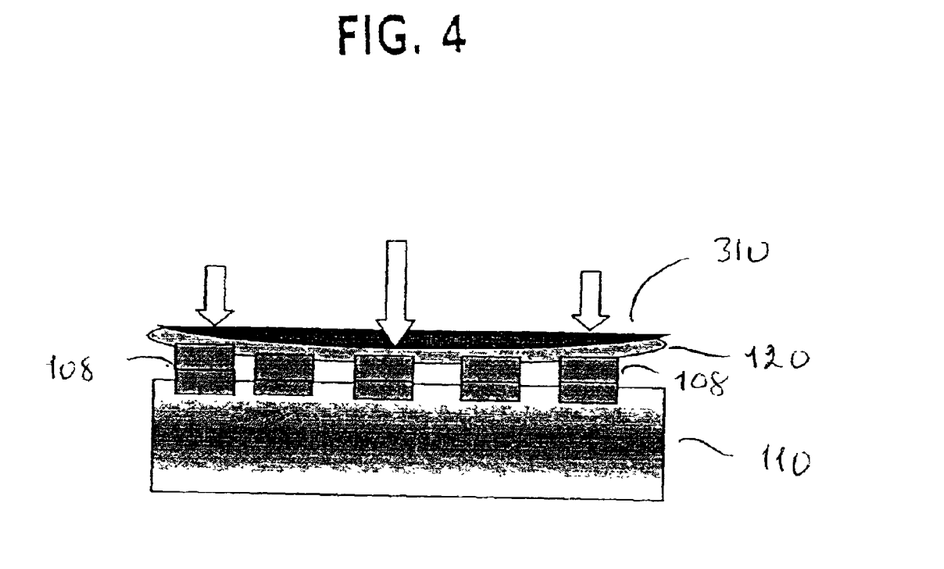
FIG. 4 illustrates an example wafer bonding process using a flexible bladder press according to an embodiment of the present invention.

For example, if Si wafer 120 has an area of 1 mm² and a thickness of 500 μm, the pressure needed to deflect 1000 Å of the Si wafer 120 will be 800 PSI. Likewise, if the thickness of the Si wafer 120 is 50 μm, the pressure needed for the same 1000 Å deflection will be only 8 PSI. Additional pressure may compromise the structural integrity of the Si wafer 120. If the pressure needed to deflect the Si wafer 120 is determined in the manner described above, the bladder press 310 can be very effective at increasing the metal bonding between the two wafers 110 and 120 and providing planar contact across the Si wafer 120 with height variations in the bonding areas as shown in FIG. 4. An example deflection TABLE may be shown as follows:

| L | P | h | δ |
|---|---|---|---|
| 1 mm | 800 PSI | 500 μm | 1000 Å |
| 1 mm | 8 PSI | 50 μm | 1000 Å |
| 1 mm | 0.8 PSI | 5 μm | 1000 Å |

The deflection TABLE shows that thinning the wafer to 5 μm will effectively accommodate local thickness variations on a length scale of 100 μm. In order to achieve planarization at length scales less than 100 μm, it will be necessary to pay attention to metal density variations during CMP.

The flexible bladder press 310 may be available in many forms and configurations as long as it can absorb the pressure differently at different points and press the thinned top wafer 120 to account for the height differences of the metal bonding layer 108 across the opposing surfaces of the wafers 110 and 120. Examples of the many configurations of the flexible bladder press 310 are shown in FIG. 5 and FIGS. 6A–6B herein below.

Figure 5:
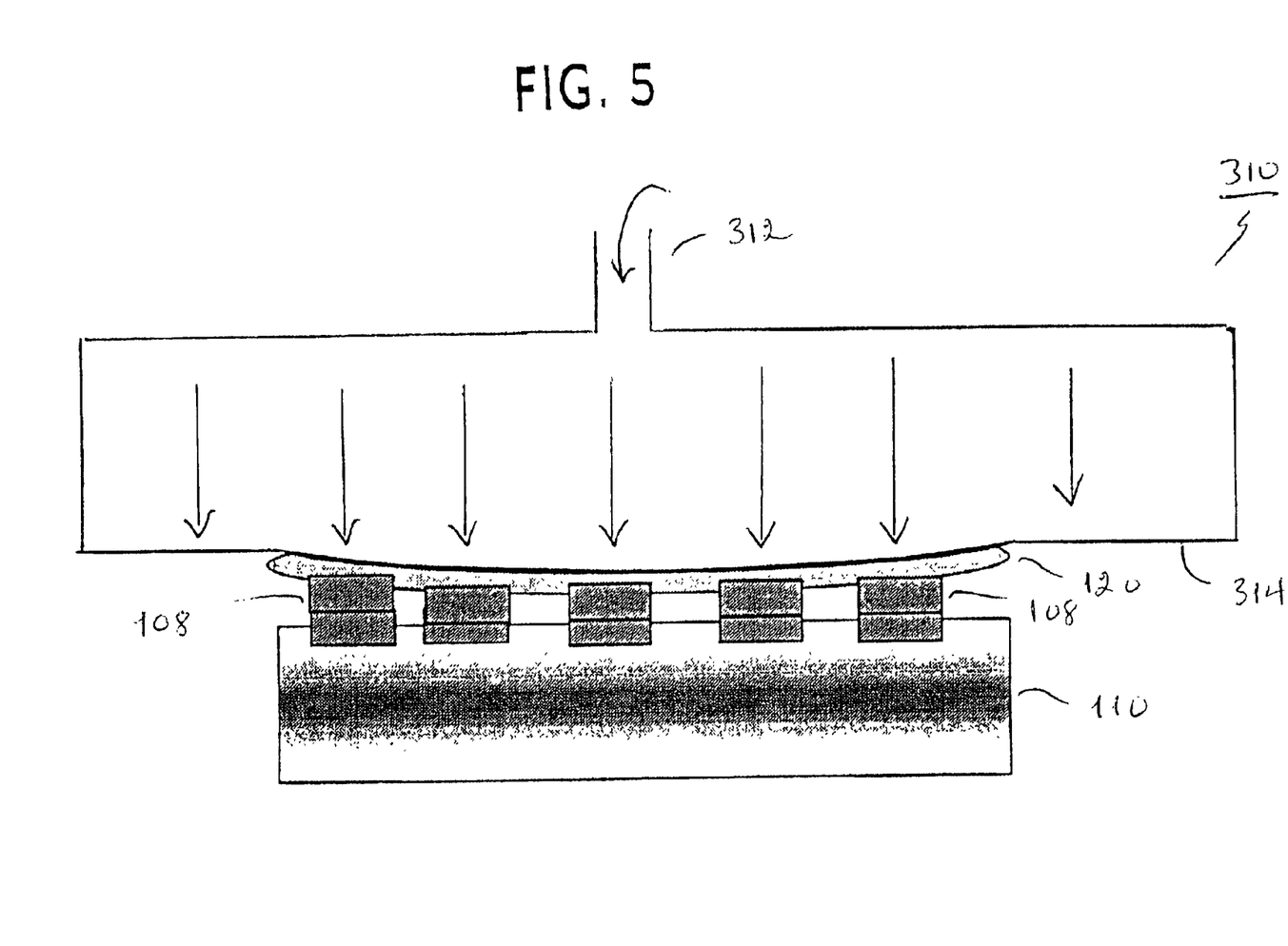
FIG. 5 illustrates an example flexible bladder press according to an embodiment of the present invention.

For instance, FIG. 5 illustrates the flexible bladder press 310 as a hollow container for containing high-pressure gas. As shown in FIG. 5, the hollow container 310 can be a stainless steel container including an input valve 312 arranged to input air pressure, and a bottom thin membrane 314 positioned over the top surface of the thinned Si wafer 120 to apply pressure to the thinned Si wafer 120 to account for the height differences of the metal bonding layer 108 across the opposing surfaces of the wafers 110 and 120. Since the Si wafers 110 and 120 are extremely flat, the bonding force applied from the bottom membrane 314 of the hollow container 310 to the wafers 110 and 120 will be very uniform.

Figure 6A:
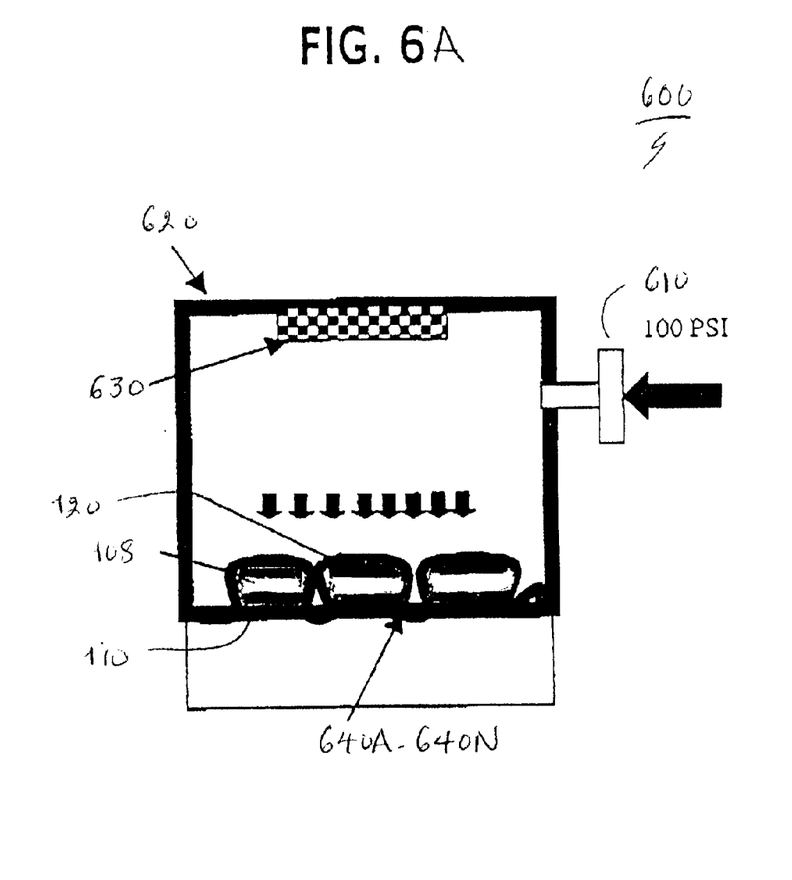
FIGS. 6A–6B illustrate an example flexible bladder press according to another embodiment of the present invention.
Figure 6B:
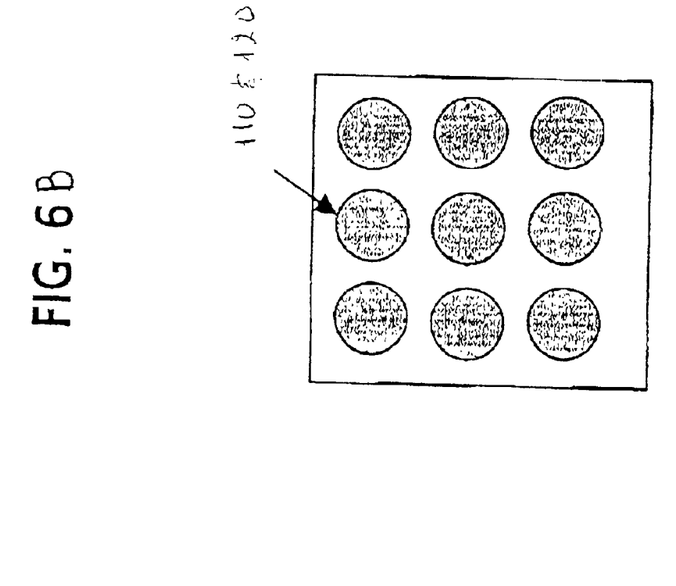

FIGS. 6A–6B illustrate another example of a flexible bladder press according to an embodiment of the present invention. More specifically, FIG. 6A shows a side view of an autoclave 600 intended to serve as a flexible bladder press; and FIG. 6B shows a top view of the autoclave 600 supporting a large number of wafers 110 and 120, for example, for metal bonding. In this example, an autoclave 600 is used to apply pressure and heat in the wafer bonding process to produce improved bond uniformity and increased wafer throughput.

As shown in FIG. 6A, an autoclave is a high-pressure vessel 600 including an input valve 610 arranged to input high-pressure gas, often much greater than 100 PSI, into a chamber 620; a heater 630 arranged to heat the gas at a predetermined temperature; and one or more high-temperature vacuum bags 640A–640N containing therein respective Si wafers.

Each vacuum bag 640 may be a flexible bag that is evacuated and then sealed. As shown in FIGS. 6A–6B, the wafers 110 and 120 shown in FIGS. 3–5 are aligned to ensure that the corresponding metal bonding layer 108 on adjacent surfaces of the wafers 110 and 120 is aligned in the stack. The aligned wafers 110 and 120 may then be placed inside respective high-temperature vacuum bags 640A–640N before the bags 640A–640N are evacuated. The air pressure inside the vacuum bags 640A–640N may clamp the wafers 110 and 120 together to preserve the alignment and pre-bond the wafers 110 and 120 with a metal bonding layer 108.

After the aligned wafers are placed in the high-temperature vacuum bags 640A–640N and the vacuum bags 640A–640N are evacuated, each bag and wafer assembly is placed in the high-pressure chamber 620. The autoclave 600 is then pressurized to, for example, 100 PSI. The high-pressure gas, typically in a semi-liquid form, can then be heated by the heater 630 in the chamber 620 and the semi-liquid can evenly apply heat and pressure to the wafers inside the vacuum bag 640 to be bonded. After the wafers (110 and 120 shown in FIGS. 3–5) are bonded using the metal bonding layer 108, the chamber pressure is reduced and the bonded wafers are allowed to cool and subsequently removed.

For the metal bonding process to allow for thickness variations in the metal bonding layer 108 and to ensure that all active device wafers 110 and 120 are bonded more uniformly, uniform pressure and uniform heating in the autoclave 600 are important. However, since Si wafers are extremely flat, using air pressure in the autoclave chamber 620 to apply the bonding force will deliver extremely uniform and conformable pressure across the wafers. Likewise, the heated gas will also deliver very uniform heating across the wafers during metal bonding. As a result, the autoclave 600 shown in FIG. 6 can have approximately an order of magnitude improvement in pressure uniformity, temperature uniformity and far greater wafer throughput for the bonding process.

As described in this invention, the flexible bladder press according to different embodiments of the present invention can effectively produce greater contact surface area across a wafer with height variations in the bonding areas.

While there have been illustrated and described what are considered to be exemplary embodiments of the present invention, it will be understood by those skilled in the art and as technology develops that various changes and modifications may be made, and equivalents may be substituted for elements thereof without departing from the true scope of the present invention. For example, the flexible bladder press can also be replaced by a pressure balloon which may assert pressure differently at different points to press the thinned top wafer against the bottom wafer to account for the height differences of the metal bonding layer across the opposing surfaces of the top and bottom wafers. In addition, air pressure may also be replaced by liquid pressure. Many modifications may be made to adapt the teachings of the present invention to a particular situation without departing from the scope thereof. Therefore, it is intended that the present invention not be limited to the various exemplary embodiments disclosed, but that the present invention includes all embodiments falling within the scope of the appended claims.

What is claimed is:

1. A three-dimensional (3-D) integrated chip system, comprising:
   a first wafer including one or more integrated circuit (IC) devices;
   a second wafer including one or more integrated circuit (IC) devices; and
   a metal bonding layer deposited on opposing surfaces of the first and second wafers at designated locations to establish electrical connections between active IC devices on the first and second wafers and to provide metal bonding between the adjacent first and second wafers, when the first wafer is pressed against the second wafer using a flexible bladder press to account for height differences of the metal bonding layer across the opposing surfaces of the first and second wafers.

2. The three-dimensional (3-D) integrated chip system as claimed in claim 1, wherein the metal bonding layer includes a plurality of copper (Cu) lines on opposing surfaces of the first and second wafers to serve as electrical contacts between active IC devices on both the first and second wafers.

3. The three-dimensional (3-D) integrated chip system as claimed in claim 1, wherein the flexible bladder press is a hollow steel container including an input valve arranged to input air pressure, and a bottom membrane positioned over the surface of the first wafer to apply the pressure differently at different points on the first wafer as the first wafer is pressed against the second wafer to account for the height differences of the metal bonding layer across the opposing surfaces of the first and second wafers.

4. The three-dimensional (3-D) integrated chip system as claimed in claim 1, wherein the pressure required to account for the height differences of the metal bonding layer across the opposing surfaces of the first and second wafers is determined based on the following equations:

$$\delta = \frac{qL^4}{8EI}, \text{ and } I = \frac{bh^3}{3}$$

where "$\delta$" indicates the total deflection on the first wafer; "L" indicates the length of the first wafer; "q" indicates the load intensity; "E" is the Young modulus of elasticity of the first wafer; and "I" indicates the moment of inertia of the rectangular cross-section; and where "h" indicates the thickness of the first wafer, and "b" indicates the cross-section dimension of the first wafer.

5. The three-dimensional (3-D) integrated chip system as claimed in claim 1, wherein the first wafer is thinner than the second wafer to conform to the height differences of the metal bonding layer across the opposing surfaces of the first and second wafers.

6. The three-dimensional (3-D) integrated chip system as claimed in claim 1, wherein the flexible bladder press is an autoclave including an input valve arranged to input high-pressure gas into a chamber; a heater arranged to heat the gas at a predetermined temperature; and at least one vacuum bag arranged to contain the first and second wafers in position for metal bonding.

7. The three-dimensional (3-D) integrated chip system as claimed in claim 6, wherein the vacuum bag is a flexible bag that is evacuated and then sealed to ensure that the first and second wafers are bonded, via the metal bonding layer.

8. A three-dimensional (3-D) integrated chip system, comprising:
   a first wafer including one or more integrated circuit (IC) devices, and metallic bumps arranged to electrical interconnection;
   a second wafer including one or more integrated circuit (IC) devices, and metallic bumps arranged for electrical interconnection and with alignment with the first wafer to form a stack; and
   a flexible bladder press arranged to press the first wafer against the second wafer to bond the metallic bumps on the surface of the first wafer with the metallic bumps on the surface of the second wafer and establish electrical connections between active IC devices on the adjacent wafers.

9. The three-dimensional (3-D) integrated chip system as claimed in claim 8, wherein the flexible bladder press is arranged to press the first wafer against the second wafer to account for height differences of the metallic bumps across the opposing surfaces of the first and second wafers.

10. The three-dimensional (3-D) integrated chip system as claimed in claim 8, wherein the flexible bladder press is a hollow steel container including an input valve arranged to input air pressure, and a bottom membrane positioned over the surface of the first wafer to apply the pressure differently at different points on the first wafer as the first wafer is pressed against the second wafer to account for the height differences of the metallic bumps across the opposing surfaces of the first and second wafers.

11. The three-dimensional (3-D) integrated chip system as claimed in claim 8, wherein the pressure required to account for the height differences of the metallic bumps across the opposing surfaces of the first and second wafers is determined based on the following equations:

$$\delta = \frac{qL^4}{8EI}, \text{ and } I = \frac{bh^3}{3}$$

where "$\delta$" indicates the total deflection on the first wafer; "L" indicates the length of the first wafer; "q" indicates the load intensity; "E" is the Young modulus of elasticity of the first wafer; and "I" indicates the moment of inertia of the rectangular cross-section; and where "h" indicates the thickness of the first wafer, and "b" indicates the cross-section dimension of the first wafer.

12. The three-dimensional (3-D) integrated chip system as claimed in claim 8, wherein the first wafer is thinner than the second wafer to conform to the height differences of the metallic bumps across the opposing surfaces of the first and second wafers.

13. The three-dimensional (3-D) integrated chip system as claimed in claim 8, wherein the flexible bladder press is an autoclave including an input valve arranged to input high-pressure gas into a chamber; a heater arranged to heat the gas at a predetermined temperature; and at least one vacuum bag arranged to contain the first and second wafers in position for metal bonding.

* * * * *